United States Patent
Basel (12)

(10) Patent No.: US 6,260,175 B1
(45) Date of Patent: *Jul. 10, 2001

(54) METHOD FOR DESIGNING AN INTEGRATED CIRCUIT USING PREDEFINED AND PREVERIFIED CORE MODULES HAVING PREBALANCED CLOCK TREES

(75) Inventor: Peter Basel, Bolton, MA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/813,340

(22) Filed: Mar. 7, 1997

(51) Int. Cl.$^7$ ..................................................... G06F 17/50
(52) U.S. Cl. ........................................ 716/1; 716/5; 716/6
(58) Field of Search .................................. 364/488, 489, 364/490, 491; 395/500; 326/93, 94, 95; 716/5, 1, 6

(56) References Cited

U.S. PATENT DOCUMENTS

| | | | |
|---|---|---|---|
| 5,218,551 | * | 6/1993 | Aggrawal et al. ............ 716/10 |
| 5,262,959 | * | 11/1993 | Chkoreff ........................ 716/18 |
| 5,410,491 | * | 4/1995 | Minami .......................... 716/6 |
| 5,557,779 | * | 9/1996 | Minami .......................... 716/6 |
| 5,705,942 | * | 1/1998 | Ashuri ........................... 326/93 |
| 5,774,371 | * | 6/1998 | Kawakami ..................... 716/10 |
| 5,912,820 | * | 6/1999 | Kerzman et al. ............... 716/6 |

OTHER PUBLICATIONS

LSI Logic Publication entitled, "G10 ASIC Products Tenth Generation ASIC Technology," 1995, 1 page (front and back).
LSI Logic Publication entitled, "CoreWare Design Program and Cores," 1995, 1 page (front and back).

* cited by examiner

Primary Examiner—Matthew Smith
Assistant Examiner—Vuthe Siek
(74) Attorney, Agent, or Firm—Conley, Rose & Tayon

(57) ABSTRACT

A method of designing an integrated circuit including at least one predefined core module and a custom logic circuit whereby clock skew between the core module and the custom logic circuit may be reduced. An integrated circuit designer selects core modules having desired functionality for inclusion within an integrated circuit from a library of core modules. Each core module in the library is predefined and pre-verified and may be provided as a synthesizeable register-transfer level (RTL) description which can be synthesized along with RTL descriptions of other logic blocks in the integrated circuit. Alternatively, each core module may be provided as a pre-laidout integrated circuit mask which can be included in the final integrated circuit mask design. Upon selection of appropriate core modules, the designer defines a custom logic circuit for integration with the core modules. Each core module is advantageously provided with multiple clock inputs, each having a relatively low fan-out of associated clocked elements. In one embodiment, the fan-out associated with each clock input of a core module is limited to eight. Since the fan-out associated with each clock input is selectively low, each clock input may be connected to form a leaf-level component of a chip-level balanced clock tree (BCT) clock distribution structure associated with the integrated circuit as a whole.

11 Claims, 4 Drawing Sheets

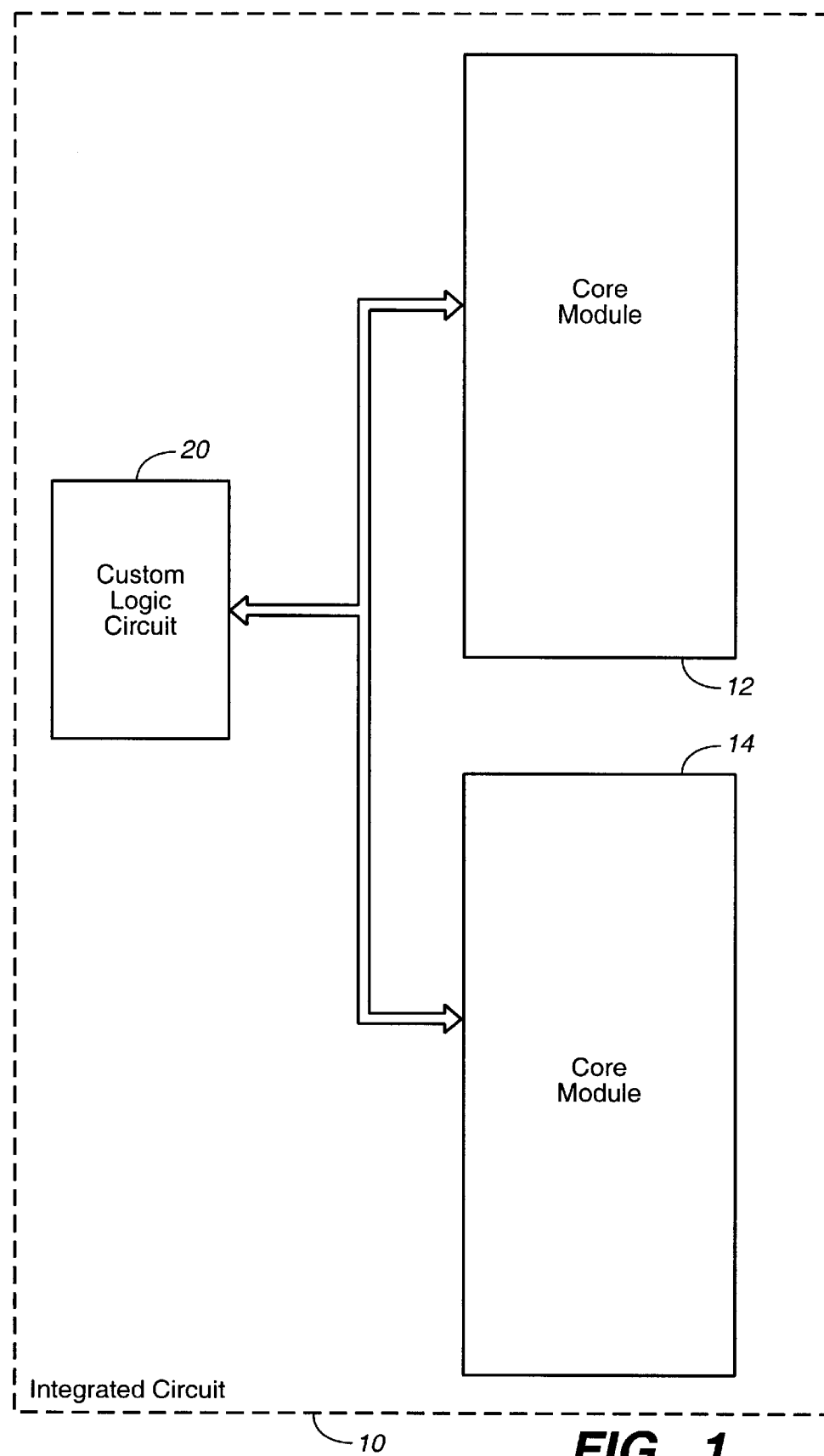
FIG._1

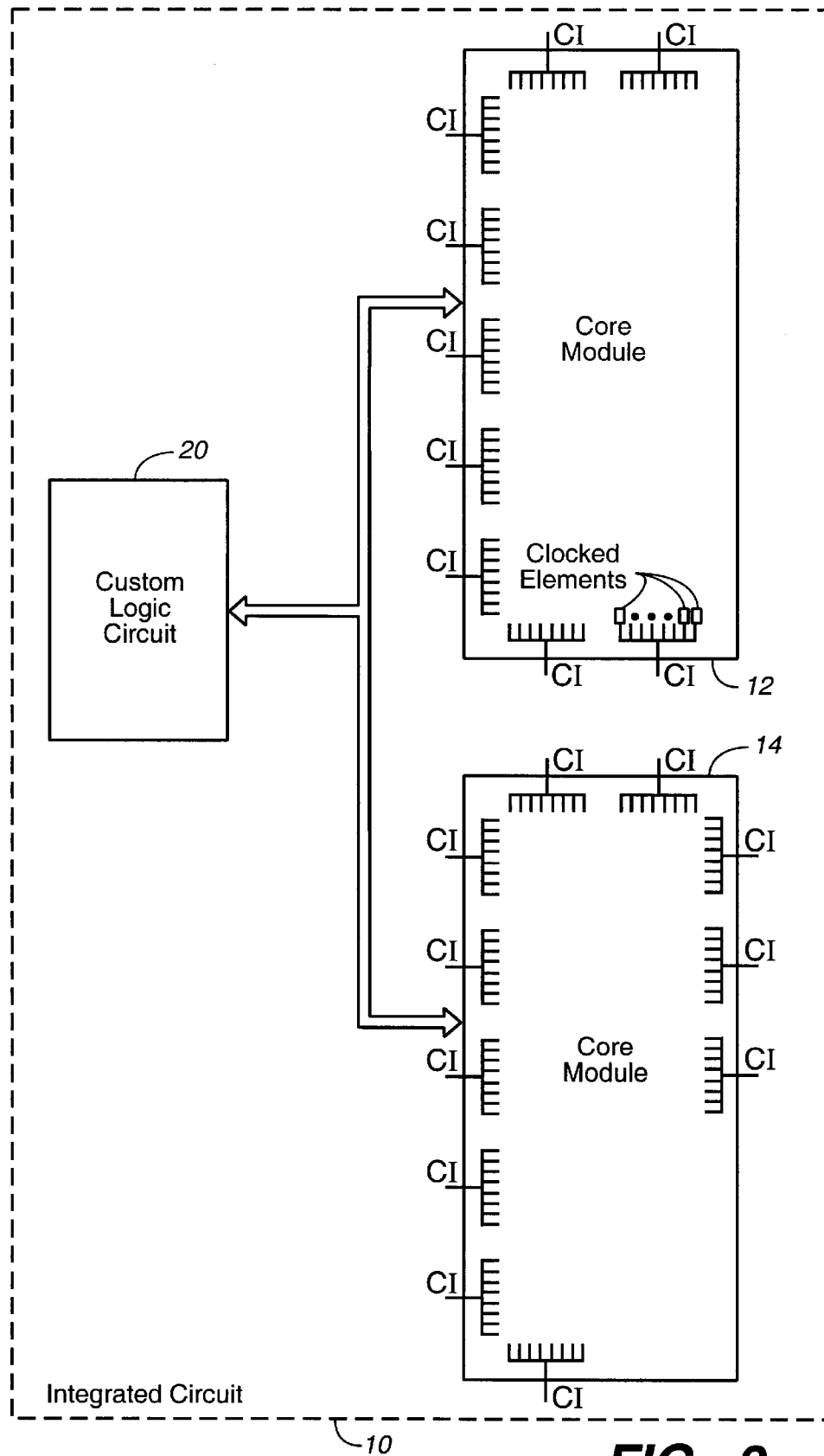
FIG._2

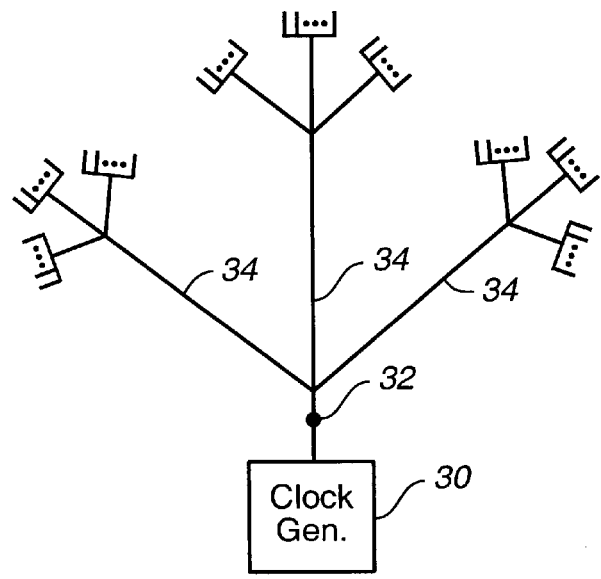
FIG._3A
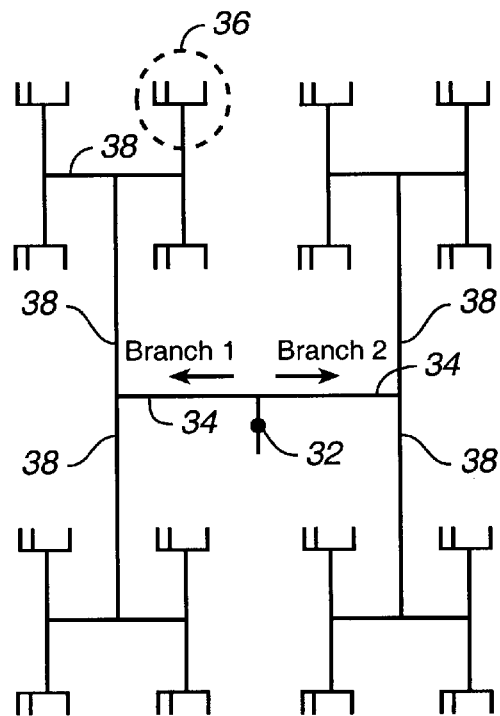
FIG._3B

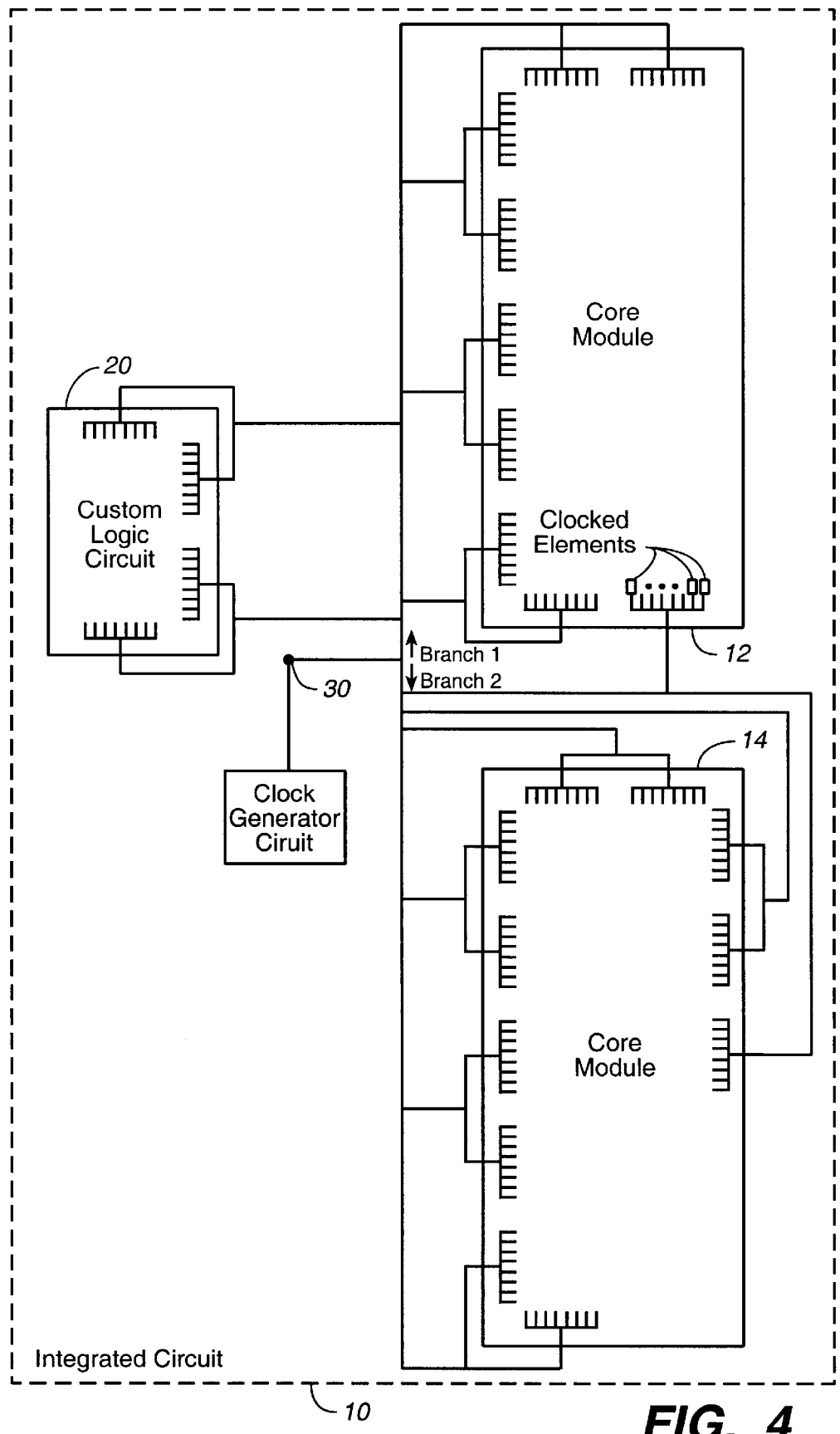
FIG._4

METHOD FOR DESIGNING AN INTEGRATED CIRCUIT USING PREDEFINED AND PREVERIFIED CORE MODULES HAVING PREBALANCED CLOCK TREES

BACKGROUND OF THE INVENTION

1. Field of the Invention

This invention relates to the field of integrated circuits and, more particularly, to the design of integrated circuits using predesigned and preverified core modules.

2. Description of the Related Art

In the past, integrated circuits were typically designed by defining the functionality of the integrated circuit as a whole and then designing from scratch the circuitry to implement the functionality. Computer aided design tools have long been employed to assist in the design of the transistor level circuitry. Upon definition of the transistor level circuitry, the mask layout of the integrated circuit is created.

Integrated circuits were often limited as to the number of transistors which could be employed therein. Accordingly, the amount of functionality included in a particular integrated circuit was rather limited. Therefore, it was relatively efficient to design each new integrated circuit individually from scratch, without directly leveraging off of the chip design of past work.

More recently, the number of transistors which are included upon a given integrated circuit has increased dramatically. Integrated circuits have thereby become more complex, integrating larger amounts of functionality as the number of transistors has grown. Since integrated circuits are increasing in complexity, the amount of time required to develop and fully test the new integrated circuit is increasing as well. At the same time, due to the pace of change in the semiconductor industry, the time-to-market for a product is required to be shorter.

Accordingly, it has become increasingly popular to design integrated circuits by selecting predesigned and preverified core modules for inclusion within the integrated circuit. Each core module performs a designated sub-function and is selected from a "library" of predefined and preverified core modules. The core modules can be used in conjunction with other core modules or custom logic to perform the overall functionality of the integrated circuit. Since each core module is predefined and preverified, the designer of the integrated circuit need not be concerned with the details of implementing the sub-function implemented by the core module. Instead, the designer includes the core module in the integrated circuit design and designs additional sub-functions for which a core is not available in custom logic. Time-to-market for the integrated circuit may thereby be decreased in comparison to the amount of time formerly required to design the functionality of the integrated circuit as a whole.

Although integrated circuit design techniques employing predefined core modules have been largely successful in accommodating expedient time-to-market, certain problems have emerged which hinder the expediency of the design, particularly in high-frequency applications. One such problem relates to minimizing clock skew between the predefined core modules and the custom logic. That is, while each of the predefined core modules are typically designed with internal clock distribution networks that are balanced, clock skew between various core modules and the custom logic may become problematic, particularly in high frequency applications. This problem occurs in part since the loading associated with the clock input of each core module may differ drastically among the core modules and may differ drastically from the loading presented by the clock input of the custom logic. Typically, substantial time and effort must be devoted to reducing clock skew between the core modules and the custom logic, and often extra logic such as phase locked loop circuits or data lock up latches must be employed. Accordingly, the integrated circuit may become larger in size, may become more difficult to test, and may be more complex to design. A method is desirable wherein an integrated circuit may be designed using predefined core modules integrated with custom logic wherein clock skew may be reduced without the requirement of additional phase lock loop circuits or lock up latches, and wherein overall design and test may be simplified.

SUMMARY OF THE INVENTION

The problems outlined above are in large part solved by a method for designing an integrated circuit including at least one predefined core module and a custom logic circuit in accordance with the invention whereby clock skew between the core module and the custom logic circuit may be reduced. In one embodiment, an integrated circuit designer selects core modules having desired functionality for inclusion within an integrated circuit. The core modules are selected from a library of core modules. Each core module in the library is predefined and pre-verified and may be provided as a synthesizeable register-transfer level (RTL) description which can be synthesized along with RTL descriptions of other logic blocks in the integrated circuit. Alternatively, each core module may be provided as a pre-laidout integrated circuit mask which can be included in the final integrated circuit mask design. Upon selection of appropriate core modules, the designer defines a custom logic circuit for integration with the core modules. Each core module is advantageously provided with multiple clock inputs, each having a relatively low fan-out of associated clocked elements. In one embodiment, the fan-out associated with each clock input of a core module is limited to eight. Since the fan-out associated with each clock input is selectively low, each clock input may be connected to form a leaf-level component of a chip-level balanced clock tree (BCT) clock distribution structure associated with the integrated circuit as a whole. Accordingly, the core module timing can be balanced with the chip level timing in a simpler manner, with more precision, and without the requirement of additional phase locked loop circuits or data lock up latches. Thus, clock skew between the core modules and the custom logic may be reduced. Clock network fan-out and clock buffers associated with the core modules can be matched to those of the custom logic circuit. Additionally, pairs of (or multiples of) core module clock inputs can be joined together to match custom logic designs which use larger fan-outs, for example 16, at the leaf level. Furthermore, for designs wherein the custom logic circuit fan-out is between that of the core module fan-out and an integer multiple thereof, clock matching can be achieved by using load balancing cells, buffer re-sizing, or by placing "dummy" loads implemented in the custom logic circuit on the same net as the core module clock input.

A method of designing an integrated circuit in accordance with the present invention may advantageously allow expedient and inexpensive integrated circuit design, test, and manufacture when predefined and preverified core modules are integrated with custom logic circuitry. Clock skew between the core modules and the custom logic may be reduced, and the "drop in" attributes of the core module design methodology may be enhanced. Finally, extra logic such as phase lock loops or data lock up latches may not be required and the manual work of designing and analyzing these elements may be eliminated. This may allow for smaller designs and the ability to operate at higher frequencies. Furthermore, no new timing analysis associated with the core module may be required.

Broadly speaking, the present invention contemplates a method of designing an integrated circuit including at least one predefined and preverified core module and a custom logic circuit whereby clock skew between the core module and the custom logic circuit may be reduced. The method comprises predefining the core module with a first plurality of clock inputs, wherein each of the clock inputs of the core module is coupled to a given number of clocked elements of the core module, and selecting the core module for incorporation within the integrated circuit. The method further comprises defining the custom logic circuit with a second plurality of clock inputs, and coupling each of the clock inputs of the core module and each of the clock inputs of the custom logic circuit to a clock distribution point at which a clock signal from a clock generator circuit is conveyed. Each clock input of the core module and each clock input of the custom logic circuit may then form a leaf-level fan-out structure in a chip-level clock distribution network.

The invention further contemplates a method of designing an integrated circuit comprising predefining a first core module with a first plurality of clock inputs, wherein each of the clock inputs of the first core module is coupled to a given number of clocked elements of the first core module, and predefining a second core module with a second plurality of clock inputs, wherein each of the clock inputs of the second core module is coupled to an equal number of clocked elements of the second core module. The method further comprises selecting the first and second core modules for incorporation within the integrated circuit, and coupling each of the clock inputs of the first core module and each of the clock inputs of the second core module to a clock distribution point at which a clock signal from a clock generator circuit is conveyed.

BRIEF DESCRIPTION OF THE DRAWINGS

Other objects and advantages of the invention will become apparent upon reading the following detailed description and upon reference to the accompanying drawings in which:

FIG. 1 is a block diagram illustrating functionality to be implemented within an integrated circuit.

FIG. 2 is a block diagram that illustrates further details associated with the core modules of the integrated circuit of FIG. 1.

FIG. 3A is a diagram that illustrates a structure referred to as a balanced clock tree.

FIG. 3B is a diagram that illustrates a specific type of balanced clock tree referred to as an H-tree.

FIG. 4 is a block diagram of an integrated circuit including a clock distribution network.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Turning now to FIG. 1, a block diagram is shown of functionality to be implemented within an integrated circuit 10 designed in accordance with a method of the present invention. As shown, integrated circuit 10 includes a core module 12 and a core module 14 selected by the circuit designer for inclusion within integrated circuit 10. The core modules 12 and 14 are selected from a library of core modules. Each core module within the library has a pre-designated function. For example, the functionality of core modules within one library includes an embedded CPU, a viterbi decoder, a reed-solomon decoder, a PCI (Peripheral Component Interconnect) bus bridge, a serial bus controller, and an Ethernet controller, among many others. For the exemplary instance of FIG. 1, the circuit designer selected the functionality provided by core modules 12 and 14 for inclusion within integrated circuit 10. It is noted that any number of core modules may be included in other embodiments of an integrated circuit designed and manufactured in accordance with the present invention.

Integrated circuit 10 additionally includes a custom logic circuit 20 coupled to core module 12 and core module 14. Generally speaking, custom logic circuit 20 is representative of functionality implemented by the designer of integrated circuit 10 which was not available in the library of pre-defined core modules. Accordingly, the circuit designer appropriately designs the custom logic circuit to implement the needed functionality, and provides an appropriate interface with core modules 12 and 14, as desired.

Each core module 12 and 14 comprises a predefined and preverified block of logic which performs a sub-function of the desired function of integrated circuit 10. Each core module can be used, in conjunction with other core modules and custom logic, to perform the function integrated circuit 10 is being designed for. Since each core module is pre-defined and pre-verified, the designer of integrated circuit 10 need not be concerned with the details of implementing the sub-function implemented by the core module. Instead, the designer includes the core module in the integrated circuit as an architectural block and designs additional sub-functions for which a core is not available. Time-to-market for integrated circuit 10 may thereby be significantly shortened in comparison to the amount of time formerly required to design and test the functionality of the entire integrated circuitry including that of the core modules.

A core module may be provided in a number of ways. In one embodiment, the core modules are provided as synthesizeable register-transfer level (RTL) descriptions which can be synthesized along with RTL descriptions of other circuitry of integrated circuit 10. If a core module is provided in this manner, the integrated circuit designer has flexibility to arrange the circuitry associated with the core ("layout" the core) along with the circuitry associated with other logic blocks in order to optimize the timing aspects of integrated circuit 10. Alternatively, in another embodiment the core modules are provided as a pre-laid out circuit which can be included in the final integrated circuit mask design. While the integrated circuit designer has less flexibility in this case, the work of laying out the circuitry corresponding to the core module has been previously completed (i.e., completed prior to initiating design of the integrated circuit into which the core module is being incorporated).

Referring next to FIG. 2, a block diagram is shown which illustrates further details associated with core modules 12 and 14. Circuit portions that correspond to those of FIG. 1 are numbered identically for simplicity and clarity. As illustrated in FIG. 2, rather than providing a single clock input for each core module 12 and 14, each core module 12, 14 is defined with a plurality of clock inputs (CI). Optimally, the fan-out of clocked elements associated with each clock input is kept to a relatively small number, such as any number between two and fifty clocked elements. For example, in one implementation the fan-out associated with each clock input of core module 12 and with each clock input of core module 14 is eight. Accordingly, each clock input of core module 12 and 14 is associated with a loading of eight clocked elements (or an equivalent loading thereof). As will be discussed in further detail below, the fan-out associated with each clock input of core modules 12 and 14 is then utilized to form a leaf-level fan-out element in a balanced clock tree clock distribution network created for the integrated circuit 10 as a whole.

FIGS. 3A and 3B illustrate conceptualized clock distribution interconnect structures which may be used as models for a clock distribution network of integrated circuit 10. FIG. 3A illustrates a structure referred to as a balanced clock tree, and FIG. 3B illustrates a specific type of balanced clock tree referred to as an H-tree. In both structures, a clock signal generated by a clock generator 30 is distributed from a primary distribution point 32. The purpose of the balanced clock tree structures is to allow design and layout of an integrated circuit whereby clock skew may be minimized by approximately equalizing the loading associated with each branch 34 of the balanced clock tree. This is typically achieved by connecting similarly configured leaf-level fan-out elements 36 to either the branches 34 or equivalently locked sub-branches 38 in a symmetric fashion in the balance clock tree. As used herein, a leaf-level fan-out element is a clock distribution structure whereby a given number of clocked elements are interconnected from a common point by respective conductors, wherein each clocked element along with its respective conductor forms a load which is approximately equal to the others in the same fan-out structure. By symmetrically connecting an equal number of leaf-level fan-out elements to each branch (or sub-branch) of a balanced clock tree clock distribution network, clock skew with respect to different clocked elements in the network may be reduced. It is noted that in other configurations, an arbitrary number of sub-branches may be established between each leaf-level fan-out element and the primary clock distribution point 32, and that additional branches may be provided.

Referring back to FIG. 2, since each predefined core module 12 and 14 is configured with multiple clock inputs, each having a designated fan-out to a predetermined number of clocked elements, each is used to form a leaf-level fan-out element in a chip-level balanced clock tree interconnect structure created for integrated circuit 10. Thus, referring next to FIG. 4, in one embodiment the integrated circuit designer configures custom logic circuit 20 with multiple clock inputs wherein each is associated with a fan-out of the same number of clocked elements as each of the clock inputs associated with core module 12 and/or 14. In this manner, each clock input of the custom logic circuit 20 is also utilized to form a leaf-level fan-out element in the chip-level balanced clock tree interconnect structure. According to this configuration, a balanced clock tree clock distribution network may be readily formed to interconnect the primary clock distribution point 30 to each of the various clocked elements. It is noted that the balanced clock tree clock distribution structure may be designed by utilizing various BCT computer aided design software tools, and that the fan-out associated with custom logic circuit 20 may be defined by such BCT tools. It is further noted that one or more clock driver circuits or clock repeater circuits may be connected at various points within the clock distribution structure, as desired.

Design of integrated circuit 10 using a methodology as described above may advantageously allow expedient and inexpensive circuit design, test, and manufacture. Clock skew between the core modules 12 and 14 and the custom logic circuit 20 may be reduced, and the "drop-in" attributes of the core module design methodology may be enhanced. Finally, extra logic such as phase lock loops or data lock up latches may not be required and the manual work of designing and analyzing these elements may be eliminated. This thus, allows for smaller designs and the ability to operate at higher frequencies.

In another embodiment, the fan-out associated with each clock input of the custom logic circuit 20 may be designed with a number of clocked elements which is twice (or an integer multiple of) the number of clocked elements associated with the fan-out of each clock input of core module 12 and 14. In such a configuration, pairs of(or several) core module clock inputs can be joined together to form larger leaf-level fan-out elements in a balance clock tree. For instance, in one embodiment wherein the fan-out associated with each clock input of core modules 12 and 14 is eight, the custom logic circuit 20 is designed with a fan-out for each clock input of sixteen. In such a situation, pairs of clock inputs of core modules 12 and 14 are interconnected to form the leaf-level fan-out elements for use in the chip-level balanced clock tree clock distribution network.

In yet another embodiment, the fan-out associated with each clock input of custom logic circuit 20 may be defined with a number of clocked elements which is between the number of clocked elements associated with each clock input of core modules 12 and 14 and an integer multiple thereof For example, in one specific implementation the number of clocked elements associated with the fan-out of each clock input of custom logic circuit 20 is ten. The fan-out of clocked elements associated with clock inputs of core modules 12 and 14, on the other hand, is eight. In such a design, the integrated circuit designer (or BCT software tool) allocates two clocked elements in the custom logic circuit 20 for inclusion within each leaf-level fan-out element of core modules 12 and 14. In this manner, the number of clocked elements in each leaf-level fan-out element for use in the chip-level balance clock tree network of the integrated circuit will be ten. Alternatively, the integrated circuit designer may employ load balancing cells or buffer re-sizing to match the loads presented by each leaf-level fan-out element of core modules 12, 14 and custom logic circuit 20 to provide proper balancing in the chip-level balanced clock tree structure.

In yet another embodiment, a plurality of core modules, each having a plurality of clock inputs with a designated fan-out, are interconnected in an integrated circuit without inclusion of custom logic.

Numerous variations and modifications will become apparent to those skilled in the art once the above disclosure is fully appreciated. It is intended that the following claims be interpreted to embrace all such variations and modifications.

What is claimed is:

1. A method of designing an integrated circuit including at least one predefined and preverified core module and a custom logic circuit, said method comprising:

predefining said core module with a first plurality of clock inputs, wherein each of said clock inputs of said core module is coupled to a first given number of clocked elements of said core module, and wherein said first given number is identical for each of said clock inputs of said core module;

preverifying a proper operation of said core module;

selecting said core module for incorporation within said integrated circuit from a library of a plurality of predefined and preverified core modules;

defining said custom logic circuit with a second plurality of clock inputs, wherein each of said clock inputs of said custom logic circuit is coupled to a second given number of clocked elements of said custom logic circuit, wherein said second given number is identical for each of said clock inputs of said custom logic circuit, and wherein said second given number is an integer multiple of said first given number; and forming a chip-level balanced clock tree distribution network, wherein each clock input of said core module forms a leaf-level fan-out element within said chip-level balanced clock tree clock distribution network, wherein each clock input of said custom logic circuit forms an additional leaf-level fan-out element within said chip-level balanced clock tree clock distribution network, and wherein each of said clock inputs of said core module and each of said clock inputs of said custom logic circuit receive a clock signal conveyed from a clock distribution point.

2. The method as recited in claim 1, wherein said predefining said core module and said preverifying occur prior to said selecting said core module and said defining said custom logic circuit.

3. The method as recited in claim 1, wherein said second given number is equal to said first given number.

4. The method as recited in claim 1, wherein said chip-level balanced clock tree clock distribution network includes a plurality of branches which convey said clock signal from said clock distribution point to selected ones of said first plurality of clock inputs and selected ones of said second plurality of clock inputs.

5. The method as recited in claim 1, further comprising:
provide a register transfer level description of said core molecule prior to defining said custom logic circuit.

6. The method as recited in claim 1, further comprising:
providing a register transfer level description of said integrated circuit including at least predefined and preverified core module and a custom logic circuit.

7. The method as recited in claim 6, further comprising:
manufacturing said integrated circuit including at least one predefined and preverified core module and a custom logic circuit, wherein said integrated circuit includes said chip-level-balanced clock tree distribution network.

8. A method of designing an integrated circuit including a plurality of predefined and preverified core modules, said method comprising:

predefining a first core module with a first plurality of clock inputs, wherein each of said clock inputs of said first core module is coupled to a first given number of clocked elements of said first core module, and wherein said first given number is identical for each of said clock inputs of said first core module;

preverifying a proper operation of said first core module;

predefining a second core module with a second plurality of clock inputs, wherein each of said clock inputs of said second core module is coupled to a second given number of clocked elements of said second core module, wherein said second given number is identical for each of said clock inputs of said second core module, and wherein said second given number is an integer multiple of said first given number;

preverifying said proper operation of said second core module;

selecting a first core module for incorporation within said integrated circuit from a library of a plurality of predefined and preverified core modules;

selecting said second core module for incorporation within said integrated circuit from a library of a plurality of predefined and preverified core modules; and forming a chip-level balanced clock tree distribution network, wherein each clock input of said first core module forms a leaf-level fan-out element within said chip-level balanced clock tree clock distribution network, and wherein each clock input of said second core module forms an additional leaf-level fan-out element within said chip-level balanced clock tree clock distribution network, and wherein each of said clock inputs of said first core module and each of said clock inputs of said second core module receive a clock signal conveyed from a clock distribution point.

9. The method as recited in claim 8, wherein said first core module and said second core module are selected from a library of a plurality of predefined and preverified core modules.

10. The method as recited in claim 8, further comprising:
providing a register transfer level description of said integrated circuit including a plurality of predefined and preverified core modules.

11. The method as recited in claim 10, further comprising:
manufacturing said integrated circuit including a plurality of predefined and preverified core modules, wherein said integrated circuit includes said chip-level balanced clock tree distribution network.

* * * * *